(12) United States Patent
Becker et al.

(10) Patent No.: US 6,200,822 B1
(45) Date of Patent: Mar. 13, 2001

(54) METHOD FOR DETECTING THE TRANSITION BETWEEN DIFFERENT MATERIALS IN SEMICONDUCTOR STRUCTURES

(75) Inventors: Volker Becker, Marxzell; Franz Laermer, Stuttgart; Andrea Schilp, Schwaebisch Gmuend, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/269,007

(22) PCT Filed: Jul. 14, 1998

(86) PCT No.: PCT/DE98/01961

§ 371 Date: Jun. 17, 1999

§ 102(e) Date: Jun. 17, 1999

(87) PCT Pub. No.: WO99/04425

PCT Pub. Date: Jan. 28, 1999

(30) Foreign Application Priority Data

Jul. 17, 1997 (DE) ................................................ 197 30 644

(51) Int. Cl.$^7$ .................................................. H01L 21/00
(52) U.S. Cl. .................................. 438/9; 216/59; 216/79; 438/714; 438/719
(58) Field of Search ............................ 438/8, 9, 14, 710, 438/712, 714, 719, 723, 735, 743; 216/2, 59, 67, 79

(56) References Cited

U.S. PATENT DOCUMENTS

| | | | |
|---|---|---|---|
| 4,430,151 | * 2/1984 | Tsukada | 438/9 X |
| 4,493,745 | * 1/1985 | Chen et al. | 438/9 |
| 4,615,761 | * 10/1986 | Tada et al. | 438/9 X |
| 5,045,149 | * 9/1991 | Nulty | 438/9 X |

FOREIGN PATENT DOCUMENTS

| | | |
|---|---|---|
| 42 41 045 | 5/1994 | (DE) . |
| 195 24 573 | 1/1996 | (DE) . |
| 0 602 855 | 6/1994 | (EP) . |
| 0 821 396 | 1/1998 | (EP) . |
| 91/18283 | 11/1991 | (WO) . |

* cited by examiner

*Primary Examiner*—William Powell
(74) *Attorney, Agent, or Firm*—Kenyon & Kenyon

(57) ABSTRACT

A method for detecting the transition between different materials in semiconductor structures during alternating etching and covering steps for anisotropic depthwise etching of defined patterns performed using a plasma. Provision is made for ascertaining, by way of an intensity measurement of at least one specific substance contained in the plasma, the beginning of each etching step by the fact that a characteristic threshold is reached, this also being achievable by way of an external synchronization signal which indicates the beginning and end of each etching step; for then, when the threshold value is reached, starting a delay time which is longer than the course of a first concentration maximum; for a second concentration maximum then to be ascertained after the delay time has elapsed; and for the second concentration maxima of the etching steps to be monitored as to whether they exceed or fall below the predefined value, in order to detect a material transition.

6 Claims, 4 Drawing Sheets

METHOD FOR DETECTING THE TRANSITION BETWEEN DIFFERENT MATERIALS IN SEMICONDUCTOR STRUCTURES

FIELD OF THE INVENTION

The present invention relates to a method for detecting the transition between different materials in semiconductor structures during alternating etching steps and covering or deposition steps for anisotropic depthwise etching of defined patterns performed using a plasma.

BACKGROUND INFORMATION

German Patent No. 42 41 045 describes a plasma etching process for silicon in which a Teflon-like protective film is applied onto the side walls of etched structures, and in a subsequent inherently isotropic etching step the silicon is etched down with fluorine radicals. By removal of the overlying side wall protective film, subsequent transport downward, and redeposition during the individual etching steps, the newly produced side wall sections are always protected from the next etching attack, resulting in a smooth side wall. If layers of different materials are present in a semiconductor structure, etching must often be performed through one layer down to the layer lying below it; i.e. the etching operation is performed until a new layer begins, and then stopped. For example, if the upper layer is made of silicon and the layer lying below it of silicon dioxide, it is usual to use an optical spectroscopy method to stop the etching process after the silicon layer has been etched through and directly after the silicon dioxide layer has been reached. The optical method involves examining the strength of the plasma emission in terms of a specific substance, by way of its characteristic emission wavelength (s). During the etching of silicon as defined in German Patent No. 42 41 045, a relatively large quantity of fluorine radicals is consumed in the etching reaction, i.e. the concentration of fluorine radicals in the plasma is relatively low. At the same time gaseous reaction products such as $SiF_2$, $SiF_3$, $SiFP_4$, etc., which in turn exhibit a characteristic emission, are produced. When etching reaches the dielectric intermediate layer, i.e. the silicon dioxide layer, the result is more or less an etching stoppage, since the etching operation proceeds much more slowly in silicon dioxide than in silicon. Because of this etching stoppage, the fluorine consumption decreases, and the quantity of free fluorine in the plasma rises correspondingly. This is detected in the optical measurement by a corresponding light emission at characteristic wavelengths. The slowing of the etching process when the silicon dioxide layer is reached moreover causes the $SiF_x$ concentration to decline, so that its light emission at characteristic wavelengths decreases, and emission of oxygen from the silicon dioxide takes place at its characteristic wavelengths. These effects can also be sensed with the optical measurement method. Using the aforementioned optical method, it is thus possible to terminate the etching process or continue it with modified parameters. This is necessary because uncontrolled overetching results in an undesired etching profile, for example in incipient etching of the vertical side walls, so that undercutting of the mask occurs with pattern loss. The originally achieved accuracy thus no longer exists, and pockets can form at the dielectric interface (between silicon and silicon dioxide).

SUMMARY OF THE INVENTION

The method according to the present invention provides, for detection of the transition between different materials in semiconductor structures with alternating etching and covering steps as defined in German Patent No. 42 41 045, a method with which precise, reproducible results can be achieved. (The terms "concentration" and "concentration maximum" will be used hereinafter; these may be replaced by the terms "intensity" and "intensity maximum," respectively, since the concentration of a substance contained in the plasma and the intensity by way of an intensity measurement of the characteristic wavelengths are proportionally related to one another.) For this purpose, it is provided that by way of an intensity measurement of at least one specific substance contained in the plasma, via its emission strength and thus its concentration, the beginning of each etching step be ascertained by the fact that a characteristic threshold is reached; that then, when the threshold value is reached, a delay time be started which is longer than the course of a first uncharacteristic concentration maximum; that a second concentration maximum then be ascertained after this delay time has elapsed; and that the second concentration maxima of the etching steps be monitored as to whether they exceed or fall below a predefined value, in order to detect the material transition. Instead of the fact of exceeding or falling below a threshold value, it is also optionally possible to ascertain the end or the beginning of the etching step by way of a synchronization signal, the generation of which will not be discussed in further detail. The present invention utilizes proposes to utilizes as an essential variable a second concentration maximum, occurring at each etching step, of a specific substance contained in the plasma. Detection of this second maximum is accomplished by the fact that by waiting for the delay time, an uncharacteristic signal peak located in each case before the maximum to be analyzed, namely a first concentration maximum, is excluded from consideration. The delay time is selected so that it is longer than the course of the first concentration maximum, so that this first concentration maximum is, e.g., blanked out. Analysis of the second characteristic concentration maximum makes available a characteristic and thus informative value for detecting the transition between different materials at each etching step. This value is preferably ascertained continuously, i.e. at each etching step. Alternatively, however, it is also possible for this value to be ascertained not at each etching step but, for example, at every other etching step. The individual second concentration maxima change in magnitude over the course of the plurality of etching steps; a dependence on the etched material thus exists. During the etching operations, as one material is left and etching of a second material begins, the informative second concentration values change, i.e. the fact of exceeding or falling below a predefined value allows the conclusion that the underlying second material has been reached. The method according to the present invention moreover permits a conclusion in terms of trend, since the change in the second concentration maximum in the course of the individual etching steps proceeds essentially continuously, thus resulting in a rise or fall in the maxima; it is evident from this that the material transition is about to be reached. It is thus possible, by way of a suitable continuous analysis, to draw conclusions as to trends.

According to another embodiment of the present invention, provision is made for a peak value of the second concentration maximum to be ascertained. The greatest value in each case is thus acquired, and utilized as an analysis criterion. Alternatively, it is also possible for several values of the second concentration maximum lying in the region of the peak to be utilized for the analysis.

Such is the case, for example, if the second concentration maximum is ascertained using a sample-and-hold method. A corresponding sample-and-hold apparatus can be used for this purpose.

It is furthermore advantageous if the semiconductor structure to be etched using fluorine radicals has at least one region made of silicon and at least one other region made of silicon dioxide, the silicon being the material first processed from the etching side and the silicon dioxide the material to be reached by the etching process as it proceeds, the rise in the second fluorine concentration to more than the predefined value resulting in detection of the material transition from silicon to silicon dioxide. The second fluorine concentration maxima thus constitute the aforementioned second concentration maxima. Alternatively, in the case of the etching of silicon down to an underlying silicon dioxide layer, provision can also be made for the decrease in a $SiF_x$ concentration maximum contained in the plasma to less than the predefined value to be ascertained and analyzed in order to detect the material transition from silicon to silicon dioxide.

DETAILED DESCRIPTION

Figure 1:
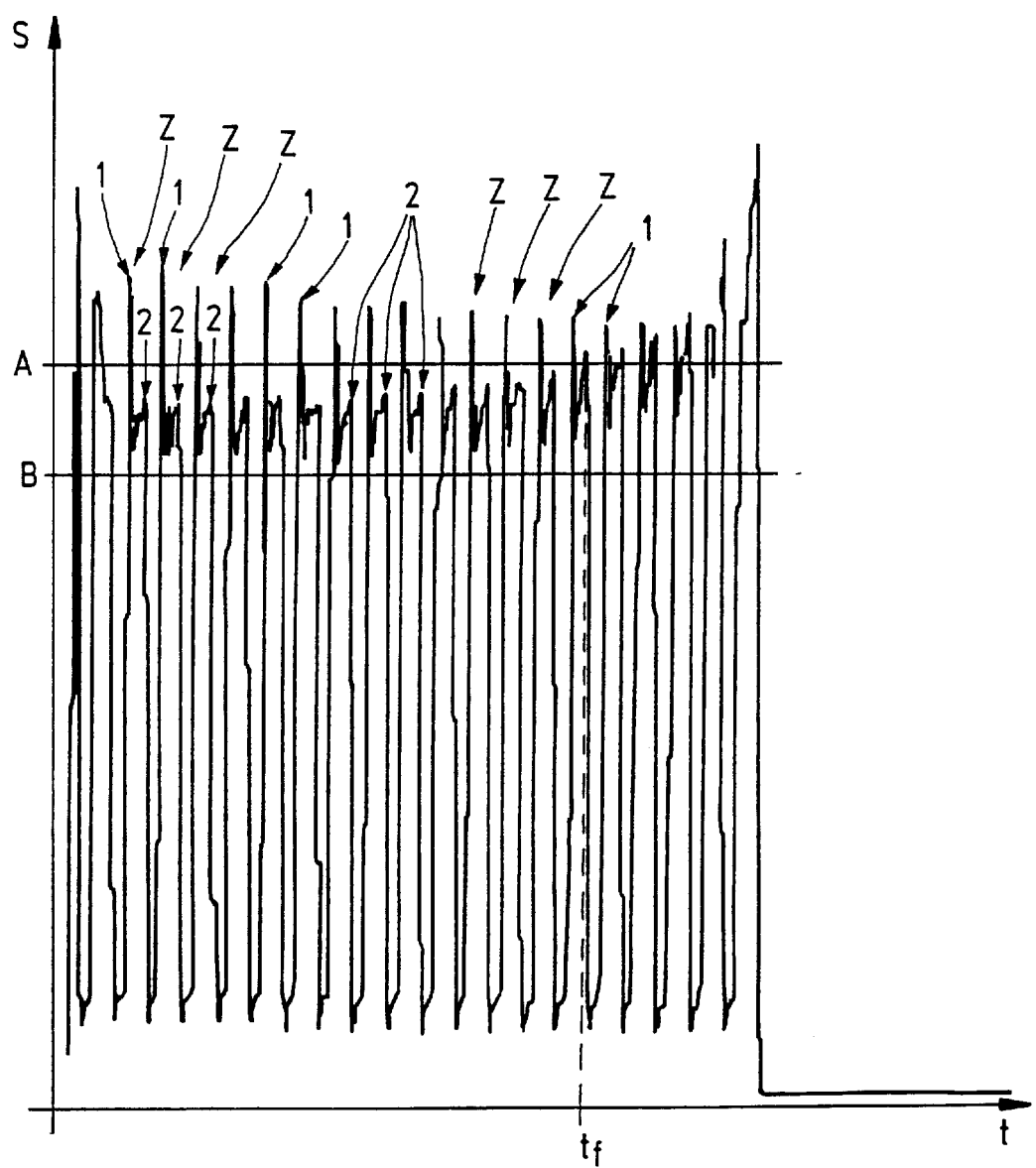
FIG. 1 shows a graph which reproduces a fluorine concentration as a function of time for a plurality of etching steps.

FIG. 1 shows a diagram on whose ordinate the fluorine concentration S (signal strength), and on whose abscissa the time t, are plotted. The curve on this diagram indicates a plurality of etching steps Z, i.e. at each etching step Z the fluorine concentration rises to a maximum value and then, when the etching step is complete, decreases to a minimum value. The etching operation being performed is depthwise plasma etching of a semiconductor structure, for example for a sensor; when viewed from the etching side, silicon (Si) is the material which is etched down to an underlying layer of silicon dioxide ($SiO_2$). This is accomplished by way of a plurality of etching steps evident from FIG. 1, the side wall of the etched structure being protected with a Teflon-like protective film during each etching step. The plasma contains fluorine radicals; because of the discontinuous process, the concentration of free fluorine fluctuates greatly in periodic fashion, as is evident from the shape of the curve in FIG. 1. At the beginning of each etching step Z, the fluorine concentration S reaches a first concentration maximum 1 which is followed, after a specific time period has elapsed, by a second concentration maximum 2. This is clearly shown in FIG. 2, which shows, in an enlarged illustration, an etching step Z in terms of the change over time in fluorine concentration S. The first concentration maximum 1, which occurs at time $t_1$, is clearly evident. The second concentration maximum 2 occurs at a later time $t_2$. A comparison between the first concentration maximum 1 and second concentration maximum 2 of etching steps Z in FIG. 1 shows that the first concentration maximum 1 is a value that is uncharacteristic in terms of the continuing etching process, i.e. a process artifact; in other words, the variable does not represent a characteristic variable in terms of reaching the silicon dioxide layer. The situation with the second concentration maximum 2 is different. A consideration of the individual etching steps over time (FIG. 1) shows that as the etching periods continue, the second concentration maximum 2 rises. This rise results from the increase in free fluorine in the plasma, since when the silicon dioxide layer is reached, the fluorine consumption for etching decreases and thus the concentration of fluorine in the plasma increases. Determination of the free fluorine in the plasma is preferably accomplished using an optical method, for example the light emission at wavelengths characteristic of fluorine is measured. To ensure that the uncharacteristic first concentration maxima are not taken into consideration in the analysis, FIG. 2 shown that a delay time τ is provided, beginning with a threshold value W of the fluorine concentration at a time $t_w$, and ending at a time $t_e$.

Figure 2:
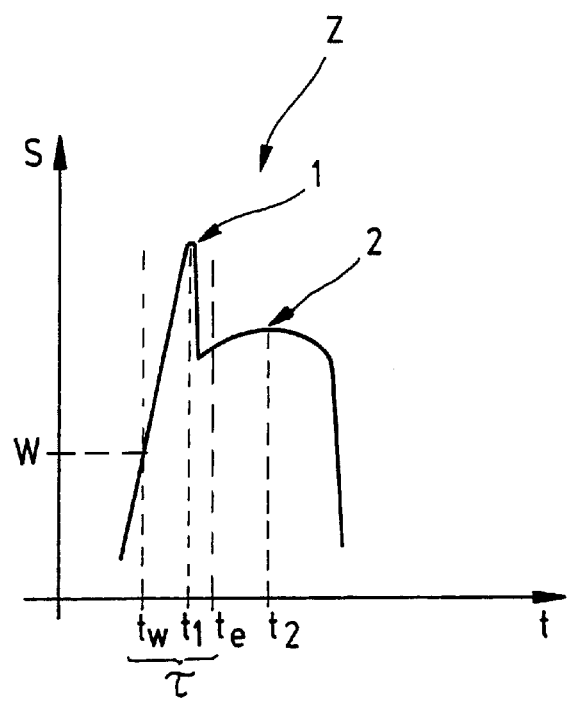
FIG. 2 shows a graph of an individual etching step illustrated in FIG. 1.

It is apparent from FIG. 2 that the first fluorine concentration peak is located in the region of delay time τ. The magnitude of threshold value W is defined as a function of the prevailing process values. Threshold value W characterizes the respective beginning of the individual etching steps Z. It thus constitutes a "trigger" for the beginning of delay time τ. What is important in this context is that threshold value W and delay time τ are selected so that the first concentration maximum 1 always definitely lies within delay time τ and consequently is blanked out, i.e. is not utilized for the analysis.

The fact that the desired etching depth has been reached, i.e. that the silicon dioxide layer has been exposed, is detected using a predefined value A which is shown in FIG. 1 and whose value is determined based on the process parameters. When the respective second concentration maximum 2 exceeds this value A in the course of the etching steps, this indicates that the etching has reached the desired depth, i.e. that the silicon dioxide layer has been exposed. In FIG. 1, this occurs at time $t_f$.

Figure 3:
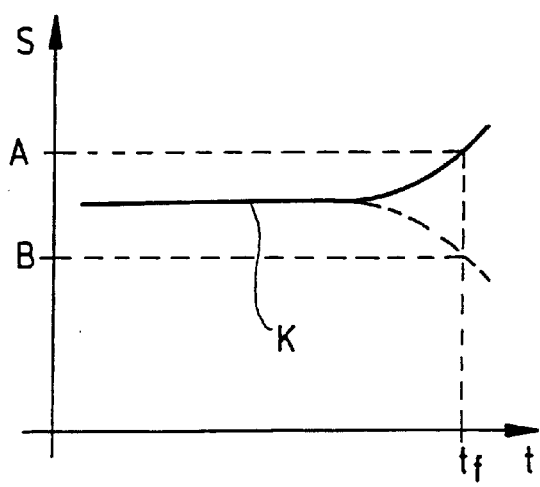
FIG. 3 shows a graph of two concentration maxima of the etching steps illustrated in FIG. 1.

FIG. 3 illustrates this procedure. Fluorine concentration S is plotted on the ordinate of the diagram shown in FIG. 3, and time t on the abscissa. Curve K represents the change in second concentration maxima 2 over the entire etching process, i.e. over the plurality of etching steps Z. It is apparent that it rises over time (solid line); i.e. the magnitude of the second concentration maxima increases toward the end of the etching process, intersecting with the predefined value A at time $t_f$. This means that the silicon dioxide layer has been exposed by the etching operation. The aforementioned procedure thus makes it possible to detect the transition between different materials.

In accordance with a further exemplary embodiment not explained below in further detail, FIGS. 1 and 3 also show a predefined value B and a downward trend in curve K (dashed line). If, in accordance with the process described above, what is ascertained during the etching process is not the fluorine concentration but the concentration of other gaseous reaction products, for example $SiF_2$, $SiF_3$, or $SiF_4$ (i.e. $SiF_x$), this concentration then decreases at the end of the etching process as shown by the dashed line in FIG. 3. These respective concentration values are also second concentration values, i.e. second concentration maxima of the above-described $SiF_x$ concentration. When this concentration maximum falls below the predefined value B, this is an indication that etching can be terminated, since the silicon dioxide layer has been exposed in the course of the individual etching steps.

Figure 4:
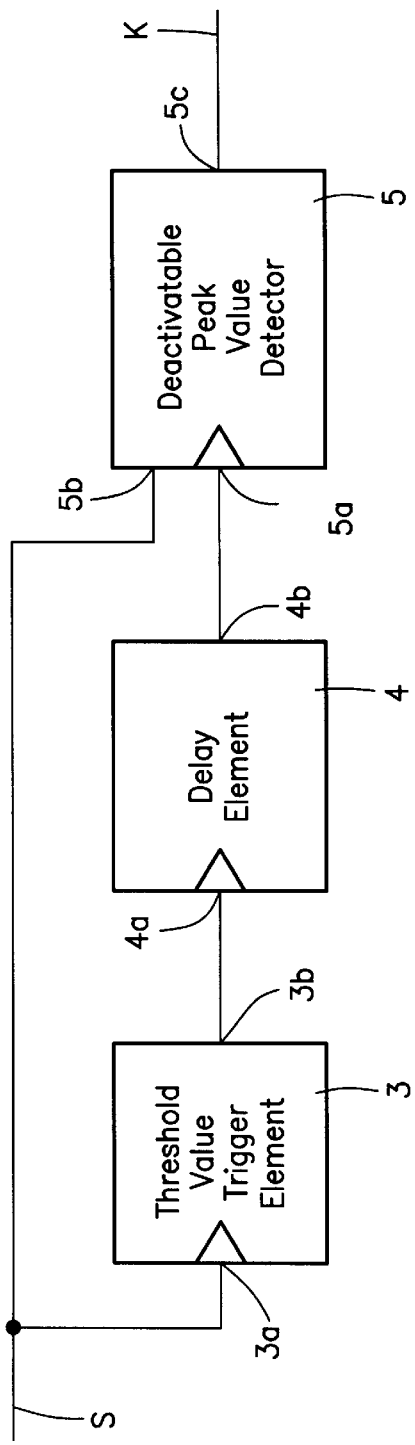
FIG. 4 shows a block diagram for performing an analysis of the measurement results.

FIG. 4 shows an implementation in the form of a block diagram for ascertaining the second concentration maxima 2. The block diagram in FIG. 4 shows a threshold value trigger element 3, a delay element 4, and a deactivatable peak value detector 5, which are electrically interconnected. The input value used for threshold value trigger element 3 is the fluorine concentration S of the plasma, which is connected directly to input 3a. Output signal 3b of threshold value trigger element 3 is made available to delay element 4 as input signal 4a. Output signal 4b of delay element 4 is conveyed to peak value detector 5 as a first input signal 5a, and activates or deactivates the latter. Peak value detector 5 receives a further second input signal 5b which represents the fluorine concentration S. The two concentration maxima K as shown in FIG. 3 are available at the output of peak value detector 5.

The following functionality results: The threshold value trigger element compares the signal for fluorine concentration S present at its input 3a to threshold value W described described above. Threshold value W can be predefined in magnitude in terms of the process parameters. When the fluorine concentration S reaches a value which is greater than the predefined threshold W, threshold value trigger element 3 generates an output signal 3b which is delivered as input signal 4a to delay element 4. Delay element 4 is thereby caused to start delay time τ. the magnitude of which has also be predefined as a function of process parameters during calibration prior to startup. The beginning of delay timeτcan also be triggered by a synchronization signal of the etching machine which indicates the beginning and end of each etching step, the beginning of each etching step being relevant for the start of delay time τ. While delay time τ is elapsing, peak value detector 5 is deactivated. Once delay time τ has elapsed, peak value detector 5 is activated at its input 5b by way of output signal 4b of delay element 4. Once peak value detector 5 has been activated, it uses input signal 5b present at its input, namely the fluorine concentration S, to generate at its output 5c the peak value for fluorine concentration S. Lastly, subsequent components (not shown in FIG. 4) are used to make a comparison between the second concentration maxima 2 and the predefined value A or B, in order to reach a conclusion as to detection of the transition between different materials in semiconductor structures during the etching process.

In an implementation not explained in further detail, peak value detector 5 shown in FIG. 4 can be replaced by a sample-and-hold element; this sample-and-hold element, by multiple sampling of fluorine concentration S and storage of those fluorine concentration values using a comparator, makes available at its output the approximate second concentration maximum value ascertained in this fashion. As in the case of peak value detector 5, the sample-and-hold element is activated and deactivated by input signal 5a arriving from delay element 4.

Figure 5:
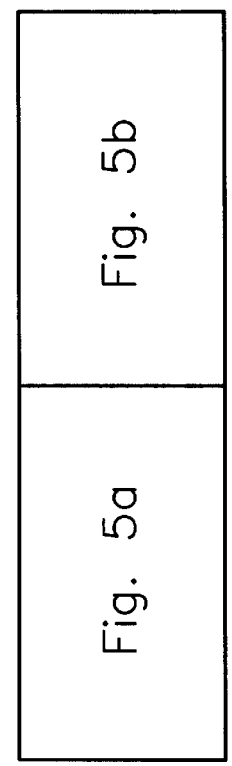
FIG. 5 shows a detailed circuit diagram of an embodiment according to the present invention.
Figure 5A:
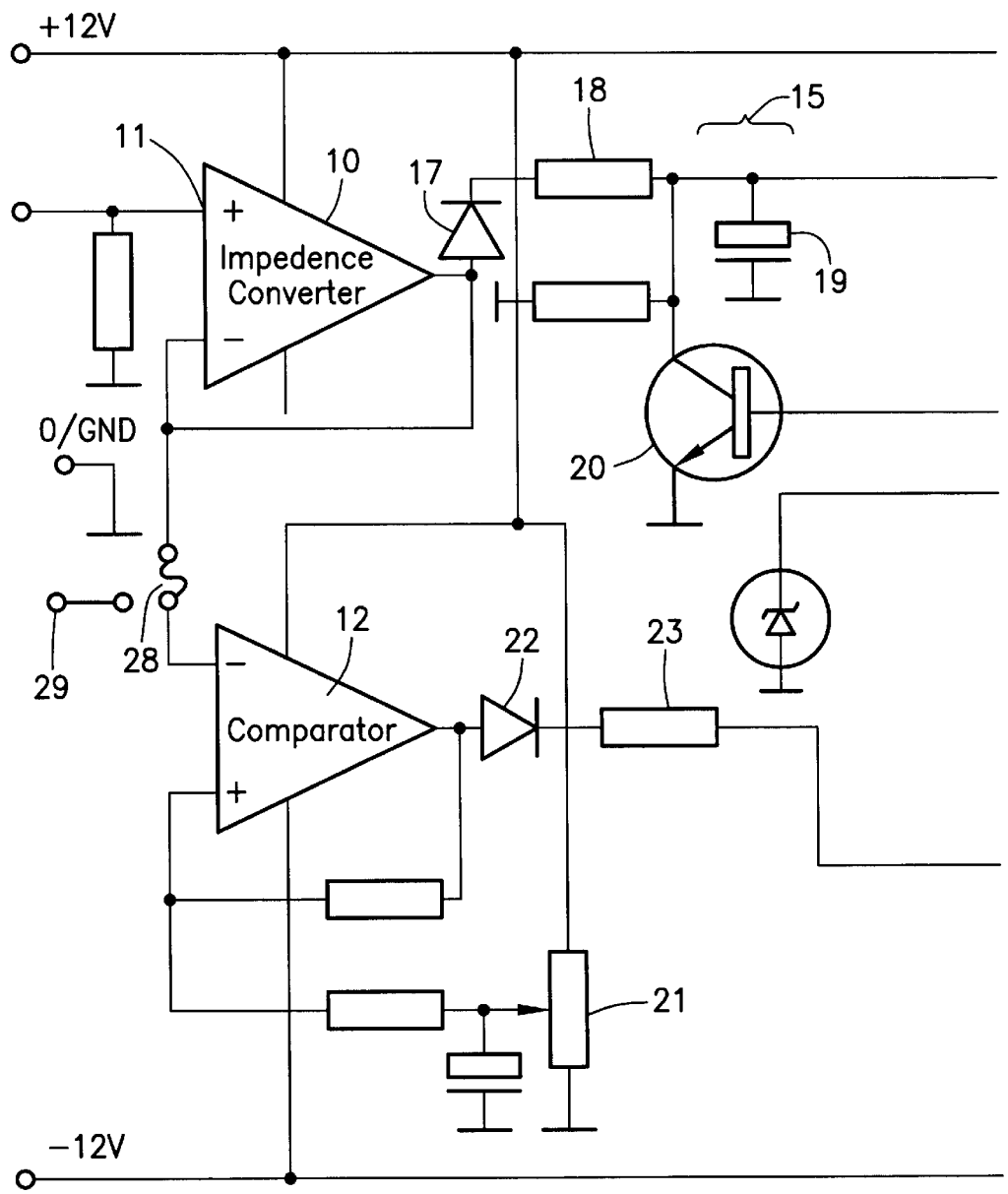

FIG. 5 shows a more detailed circuit diagram of an embodiment for carrying out the method according to the present invention. The circuit comprises the following components:

An impedance converter 10 with a gain factor of one is provided, at whose input 11 the signal ascertained during the concentration measurement is present as the output signal of an optical emission spectrometer. Also provided is a comparator 12 with hysteresis. Further components to are two timers (monoflops) 13 and 14, timer 13 being used to implement the delay time τ of a sampling stage 15, and timer 14 being provided to transfer the information from sampling stage 15 to a hold stage 16.

The following functionality results: The output signal of the optical emission spectrometer, which is present at input 11 of impedance converter 10, is conveyed, with a gain factor of one for decoupling from the remaining circuit electronics, via a diode 17 and a protective resistor 18 to a storage capacitor 19 and thus to sampling stage 15. The arrangement of diode 17 and storage capacitor 19 stores the respective maximum value of the output voltage of the optical emission spectrometer reached for each etching step. Connected in parallel with storage capacitor 19 is a discharge transistor 20; the latter short-circuits capacitor 19 during delay time τ, causing sampling to be deactivated. Memory capacitor 19 is thus set to zero during delay time τ, and therefore cannot be charged. Control of delay time τ is handled by comparator 12 with hysteresis: when the output voltage of the emission spectrometer exceeds the threshold value W preset with a "trigger level" potentiometer 21, timer 13 for delay time τ is started (via a diode 22, a resistor 23, and a transistor 24) with the leading edge of the voltage signal at the collector of transistor 24. Output 1Q of timer 13 thus goes to "high" potential, and via transistor 20 short-circuits storage capacitor 19 of sampling stage 15 during the period of delay time τ. After delay time τ has elapsed, storage capacitor 19 is enabled so that it can store the maximum value 2 of the output voltage of the optical emission spectrometer reached during the current etching cycle. As long as the etching cycle is in progress, i.e. the measured output voltage of the optical emission spectrometer is above threshold value W, the collector of transistor 24 is also at "high" potential. At the end of the etching cycle, the output voltage of the optical emission spectrometer, and thus the input voltage at input 11, drop below threshold value W and the collector of transistor 24 drops to "low" potential. The trailing edge of the collector voltage of transistor 24 sets timer 14 in order to transfer to a storage capacitor 25 of hold stage 16 the maximum voltage reached during the previous etching cycle and stored in storage capacitor 19. In this context, timer 14 generates a short output pulse at its output $\overline{2Q}$, which briefly, via a transistor 26 and a switch IC 35, connects storage capacitor 25 of hold stage 16 to the output of a buffer amplifier 27. The maximum value of the voltage achieved in the previous etching cycle is thereby transferred from storage capacitor 19 of sampling stage 15 to storage capacitor 25 of hold stage 16, and retained there. The two timers 13 and 14 are interlocked with one another, i.e. output $\overline{1Q}$ acts on clear input $\overline{2CLR}$ and $\overline{2Q}$ acts on clear input $\overline{1CLR}$, so that only one timer can be set at any one time. This prevents sampled information from being deleted during the transfer of sampled information to hold stage 16, and prevents any transfer to hold stage 16 while sampled information is being deleted.

Hold stage 16 thus stores the respective maximum value 2 of the signal intensity reached in the previous etching step, and is updated with the new maximum value 2 after each etching step. The input of comparator 12 with hysteresis can selectably be connected to the output of decoupling amplifier/impedance converter 10, and thus, as described, the output voltage of the emission spectrometer can be utilized to detect etching or deposition steps, i.e. the beginning and end of each etching step; or the input of comparator 12 is connected, by placement of a jumper 28, to the synchronization signal of the etching system via an external trigger input 29 of the circuit. The etching system then informs comparator 12, via a voltage signal, when etching is being performed and when deposition is occurring. An operational amplifier 30 transfers the voltage value of hold stage 16 to its circuit output 31, circuit output 31 being dimensioned such that a certain loading can occur. Buffer amplifier 27 makes possible the charge-transfer process from capacitor 19 to capacitor 25, while preventing any voltage dip due to loading.

What is claimed is:

1. A method for detecting a transition between different materials in a semiconductor structure, wherein the transition is detected during alternating etching steps and at least one of covering steps and deposition steps which are provided for anisotropic depthwise etching of patterns, wherein the etching steps, the covering steps and the deposition steps are performed using a plasma, the method comprising the steps of:
   a) determining a first start of each of the etching steps by measuring an intensity of at least one specific substance contained in the plasma, the first start being determined using a synchronization signal of an etching machine and when the intensity reaches a characteristic threshold value;
   b) when the intensity reaches the characteristic threshold value, initiating a second start of a delay time period, the delay time period being longer than a time of a first concentration maximum signal of the etching steps, the second start being detected using the synchronization signal of the etching machine;
   c) determining a second concentration maximum signal of the etching steps after the delay time period elapses; and
   d) determining whether the second concentration maximum signal of the etching steps is above or below a value to detect the transition between the different materials.

2. The method according to claim 1, further comprising the step of:
   e) determining a peak value of the second concentration maximum signal.

3. The method according to claim 1, wherein the second concentration maximum signal is determined using a sample-and-hold procedure.

4. The method according to claim 1, wherein the semiconductor structure is etched using fluorine radicals, the semiconductor structure including at least one first region composed of silicon and at least one second region composed of silicon dioxide, and further comprising the steps of:
   f) processing the at least one first region from an etching side; and
   g) after step (f), etching the semiconductor structure to reach the at least one second region, wherein the second concentration maximum signal is a fluorine concentration signal, and wherein step (d) comprises the substep of:
      determining the transition from the at least one first region to the at least one second region if the fluorine concentration signal rises over the value.

5. The method according to claim 1, wherein the semiconductor structure is etched using fluorine radicals, the semiconductor structure including at least one first region composed of silicon and at least one second region composed of silicon dioxide, and further comprising the steps of:
   f) processing the at least one first region from an etching side; and
   g) after step (f), etching the semiconductor structure to reach the at least one second region, wherein the second concentration maximum signal is an $SiF_x$ concentration signal contained in the plasma, and wherein step (d) comprises the substep of:
      determining the transition from the at least one first region to the at least one second region if the $SiF_x$ concentration signal falls below the value.

6. The method according to claim 1, wherein the semiconductor structure is etched using fluorine radicals, the semiconductor structure including at least one first region composed of silicon and at least one second region composed of silicon dioxide, and further comprising the steps of:
   f) processing the at least one first region from an etching side; and
   g) after step (f), etching the semiconductor structure to reach the at least one second region, wherein the second concentration maximum signal is an oxygen concentration signal, and wherein step (d) comprises the substep of:
      determining the transition from the at least one first region to the at least one second region if the oxygen concentration signal rises.

* * * * *